United States Patent [19]
Chen

[11] Patent Number: 5,962,971
[45] Date of Patent: Oct. 5, 1999

[54] LED STRUCTURE WITH ULTRAVIOLET-LIGHT EMISSION CHIP AND MULTILAYERED RESINS TO GENERATE VARIOUS COLORED LIGHTS

[76] Inventor: Hsing Chen, 5F, No. 83, Jen-Ai St., Hsinchu, Taiwan

[21] Appl. No.: 08/921,071

[22] Filed: Aug. 29, 1997

[51] Int. Cl.⁶ ........................................................ H01J 1/62
[52] U.S. Cl. .......................................... 313/512; 362/800
[58] Field of Search .............................. 313/512; 362/800

[56] References Cited

U.S. PATENT DOCUMENTS

| | | | |
|---|---|---|---|
| 5,623,181 | 4/1997 | Suehiro et al. .......................... | 313/512 |
| 5,777,433 | 7/1998 | Lester et al. ............................. | 313/512 |
| 5,813,752 | 9/1998 | Singer et al. ............................ | 362/293 |
| 5,813,753 | 9/1998 | Vriens et al. ............................ | 362/293 |

*Primary Examiner*—Sandra O'Shea
*Assistant Examiner*—Ronald E. DelGizzi
*Attorney, Agent, or Firm*—Dougherty & Troxell

[57] ABSTRACT

The innovative LED structure of the present invention mixes certain materials which can change the wave length of light in the resin of a LED and enables the LED to generate a white light and lights of various other colors as well. The shortcomings of conventional LEDs may be improved upon. By coating different fluorescent materials on the surface of a ultra violet light LED chip, it is possible to obtain a LED able to emit various colored light.

14 Claims, 4 Drawing Sheets

LED STRUCTURE WITH ULTRAVIOLET-LIGHT EMISSION CHIP AND MULTILAYERED RESINS TO GENERATE VARIOUS COLORED LIGHTS

BACKGROUND OF THE INVENTION

1. Field of the Invention

The present invention relates to an innovative structure for a light emission diode (LED), and more particularly to an innovative LED which can emit white color light with much better uniformity, color quality, and a larger projection angle than conventional LEDs.

2. Description of the prior art

At present, the LED is popularly employed in computers, communication apparatus, and electrical appliances. Generally, colors of light emitted from a LED are red, green and blue, but as a LED, it seldom generates a white light owing to the particular difficulty in controlling the color display of a white light. For example, a white light may appear from a LED element containing three primary color factors of red, green and blue (R.G.B.) when those individual colors are emitted simultaneously. But such a synthetic white light composed of R.G.B. three primary colors will not be uniformly and purely emitted because the values of current generated by three LED crystal chips of R.G.B. colors are different from one another resulting in difficulty of controlling the color display of a white color.

FIG. 1 illustrates a known method of generating a white light from a LED crystal chip published in Japanese Patent gazette 7-99345 in which a layer of yellow fluorescent material is applied on a LED crystal chip which emits a blue light. A synthetic white light may be emitted from this LED chip, but there is a problem of controlling the thickness of the fluorescent material layer on the LED which leads to non-uniform distribution of the white light produced. If the layer of the yellow fluorescent material is too thick, the synthetic light color will turn slightly yellow. On the contrary, if the layer of the yellow fluorescent material is too thin, the synthetic light color will tend to be slightly blue. Moreover, if the yellow fluorescent material is applied too excessively around the periphery of the LED chip, the resultant white light emitted from the LED when projected onto a white paper, produces a yellow colored ring which prevents the light projection angle of the LED from being wider.

SUMMARY OF THE INVENTION

It is an object of the present invention to provide an innovative structure for a LED which can overcome the drawbacks of conventional LED products and generate a white light of good color quality, which is uniformly distributed with a wider projection angle.

To achieve this object, the LED of the present invention mixes material which can change the wave length of light in the resin of a LED and enables the LED to generate not only a white light, but also lights of other various colors as well. The shortcomings of conventional LEDS may be overcome with different materials and manufacturing process from those employed in the past in order to obtain different light colors. For example, according to the present invention, by coating different fluorescent materials on the surface of an ultra violet LED chip, it is possible to obtain a LED which can emit light in various colors.

BRIEF DESCRIPTION OF THE DRAWINGS

The invention as well as its many advantages, may be further understood by the following detailed description and drawings in which.

Figure 1:
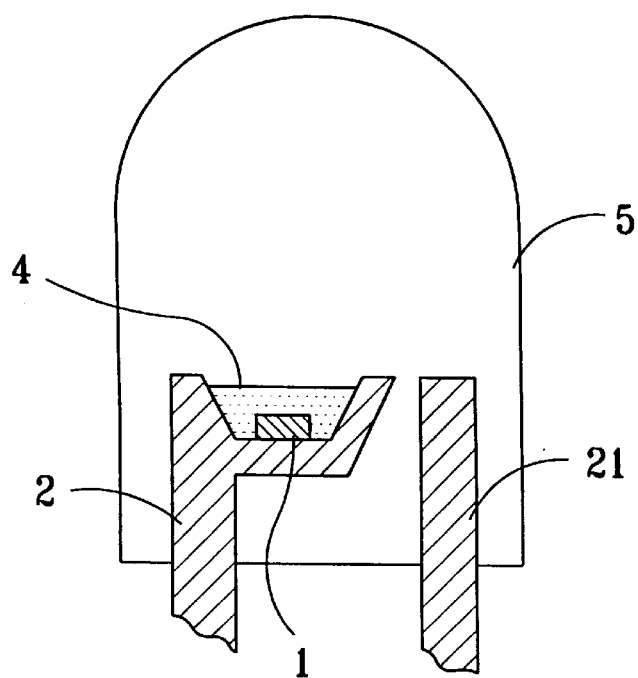
FIG. 1 is a side view showing a known LED structure.

Throughout the drawing, like terms and reference numerals are used for designation of like or equivalent parts or portions, and redundant references will be omitted for symplicity of illustration and explanation, wherein:

| | |
|---|---|
| 1: light emission chip | 5: third resin (sealing resin) |
| 2: first electrode support frame | 6: base |
| 21: second electrode supporting frame | 7: filter layer |
| 3: first resin | |
| 4: second resin (fluorescent material layer) | |

DETAILED DESCRIPTION OF THE PREFERRED EMBODIMENT

Figure 2:
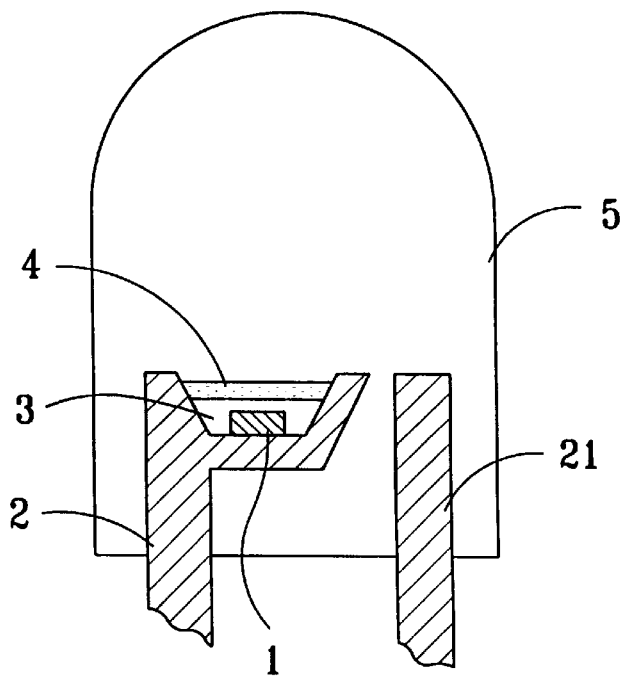
FIG. 2 is a side view showing the LED structure of the present invention in a first preferred embodiment.

FIG. 2 shows the LED structure of a first embodiment of the present invention in which a light emission chip 1 is placed in a V-shaped slot (generally called a cup) of a first electrode supporting frame 2. After connecting the conductors, a first resin 3 is coated on the V-shaped slot with its height slightly larger than the thickness of the light emission chip 1, a second resin 4 is coated on the first resin 3 after it has dried. There is a fluorescent material capable of changing the length of light waves mixed with the second resin 4 which is a thin film. After the second resin 4 has dried, a third resin 5 is applied as a sealing enclosure for the entire structure to form a finished LED product having the outstanding features of uniform quality of light color, wide light projection angle and minimum consumption of fluorescent material.

Figure 3:
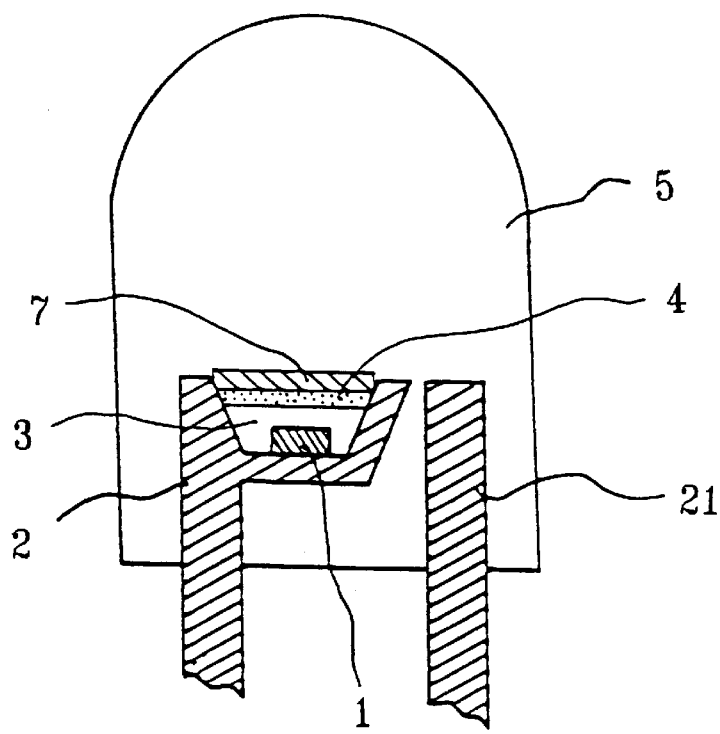
FIG. 3 is a side view showing the LED structure of the present invention in a second preferred embodiment.

FIG. 3 shows the LED structure of a second embodiment of the present invention in which a light emission chip 1 is placed in a V-shaped slot (generally called a cup) of a first electrode support frame 2. After connecting the conductors, a first resin 3 is coated on the V-shaped slot with its height slightly larger than the thickness of the light emission chip 1. A second resin 4 is coated on the first resin 3 after it has dried. A filter layer 7 is added on the second resin 4 for the purpose of filtering out the unnecessary light fluxes and at the same time, uniformly distributing the light fluxes. The light emission chip I in this embodiment utilizes an ultra violet light chip (like a material made of GaN which can emit ultra violet ray of wave length 360~380 nm) for exciting the fluorescent material contained in the second resin 4 with the ultra violet ray. Fluorescent material of various colors may be used for the production of LEDs so that a variety of finished LED products may be obtained for emitting all kinds of colored light.

A white light LED may be obtained by mixing the fluorescent materials for the three primary colors, red, green and blue, wherein the filter layer 7 is added for preventing leakage of ultra violet rays which may be harmful to the sealing resin (a third resin 5), and also for avoiding the undesired exposure of the human body to ultra violet rays.

Figure 4:
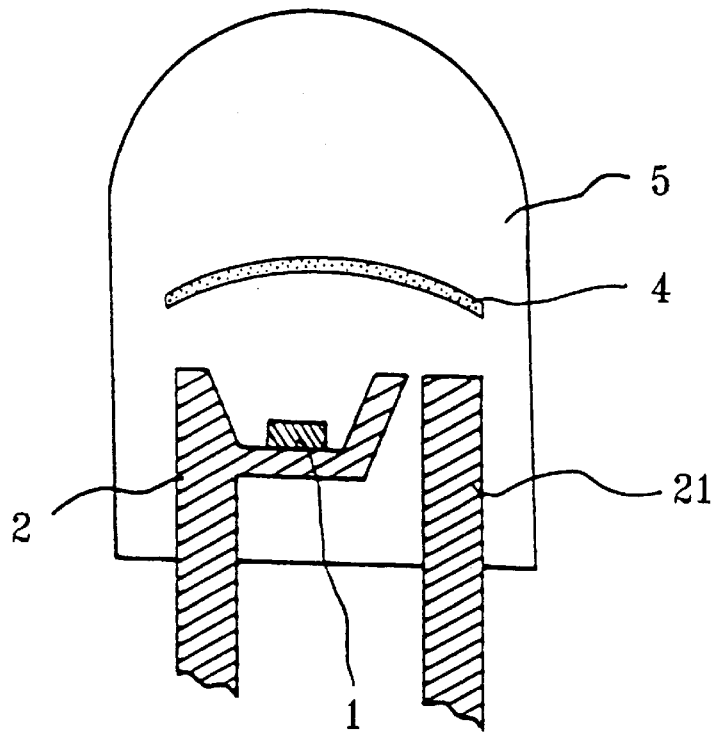
FIG. 4 is a side view showing the LED structure of the present invention in a third preferred embodiment.
Figure 4A:
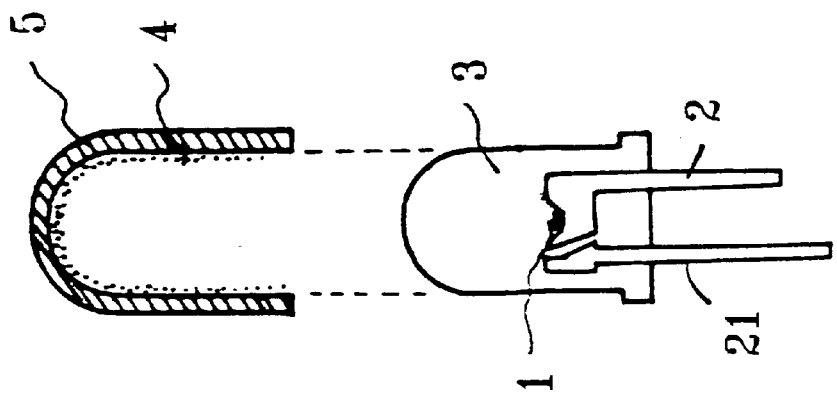
FIG. 4a is a schematic drawing illustrating a construction of the LED structure according to the third embodiment of the present invention.

FIG. 4 shows the LED structure of a third embodiment of the present invention which utilizes a different step of enclosing the LED with sealing resins. The third resin 5 is applied by implanting the resin 5 up side down for half volume. After the resin 5 has dried, a fluorescent layer of the second resin 4 is coated on the third resin 5. Then the rest of the volume is filled by the third resin 5. It should be noted that the first resin 3 and the third resin 5 used in the present case are the same material, that is, the third resin 5. The second resin 4 is implanted above the V-shaped slot of the first electrode support frame 2 and is formed in an arch configuration. The object of changing the wave length can be attained as such. Further to this, an alternation may be made to this embodiment by coating a layer of yellow light fluorescent material of a second resin 4 on the surface of 3 mmø LED to form a 5 mmø white light LED after being sealed and enclosed. Referring to FIG. 4a, in this application form, light emission chip 1 is sealed and enclosed by resin 3 to form a 3 mmø LED. Next, a layer of the second resin 4 containing a fluorescent material is coated on its surface. Finally it is sealed and enclosed with the third resin 5 to form a 5 mmø LED.

Figure 4B:
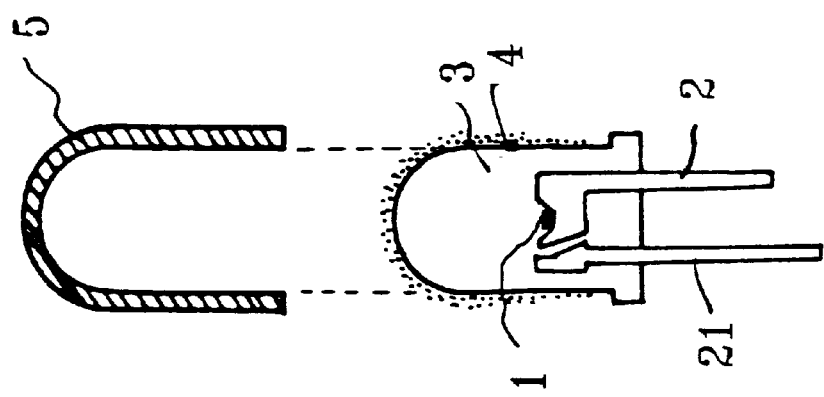
FIG. 4b is a schematic drawing illustrating another construction of the LED structure according to the third embodiment of the present invention.

The embodiment shown in FIG. 4a may also be carried out according to a form illustrated in FIG. 4b. In this case the third resin 5 is utilized to form a cap on whose inner surface a layer containing a fluorescent material of the second resin 4 capable of changing the wave length of light is coated. Afterwards the cap is sealed and enclosed together with the light emission chip 1 and the electrode supporting frame 2 and resin 3 to form a finished LED product.

Figure 5:
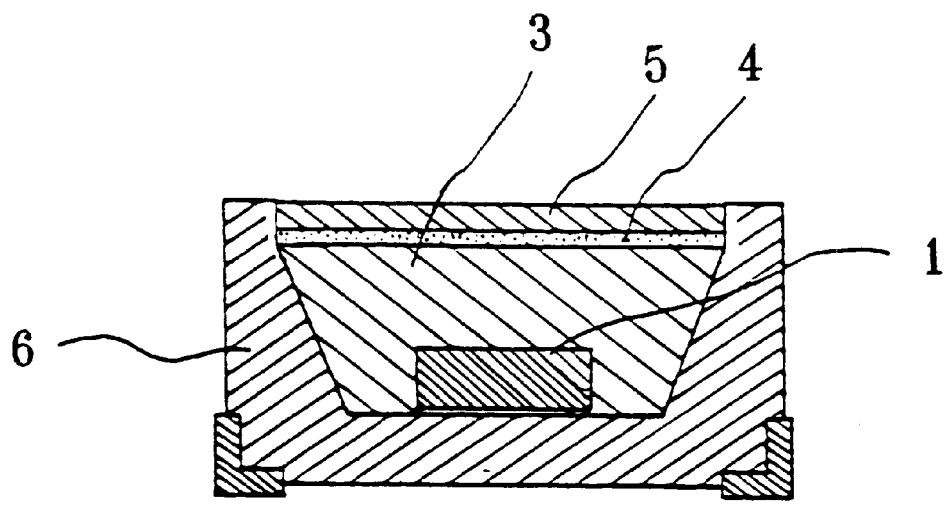
FIG. 5 is a cross-sectional view illustrating a surface adhesive type LED structure of the first embodiment of the present invention.

FIG. 5 illustrates a first embodiment of a surface adhesive type LED structure of the present invention, wherein the enclosed volume size of a surface adhesive type LED is smaller than that of a lamp type LED, yet its field of application is very wide. The light emission chip 1 is placed in a concave slot of the base 6, and is coated with a layer of the first resin 3. After drying, a fluorescent material layer of the second resin 4 is applied on it, and finally coated with the third resin 5. Thereby, a first embodiment of a surface adhesive type LED structure of the present invention is obtained.

Figure 6:
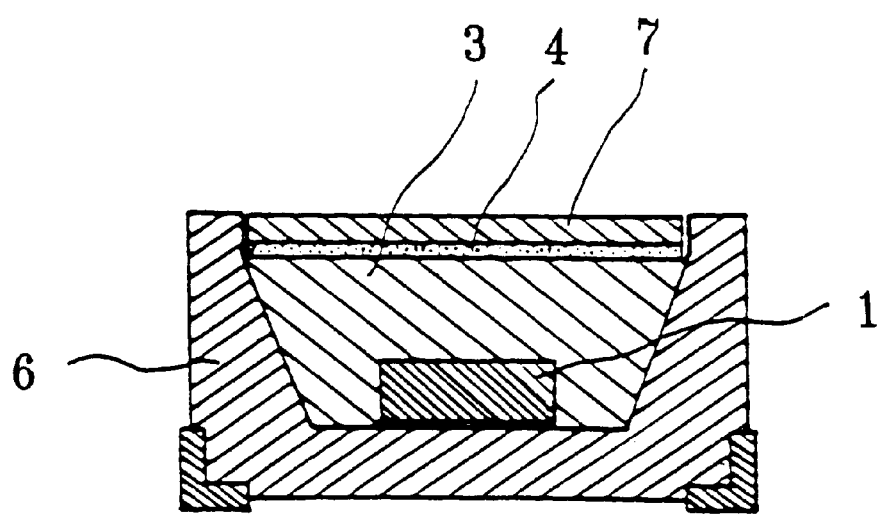
FIG. 6 is a cross-sectional view illustrating the surface adhesive type LED structure of the second embodiment of the present invention.

FIG. 6, illustrates a second embodiment of the surface adhesive type LED structure of the present invention wherein the light emission chip 1 is placed in a concave slot of the base 6, and is coated with a layer of the first resin 3. After drying, the second resin 4 is applied on it, then a filter layer 7 is formed on top of the layer of the second resin 4. Finally, after drying, a surface adhesive type LED structure of the second embodiment of the present invention is obtained.

Many changes and modifications in the above described embodiments of the invention can, of course, be carried out without departing from the scope thereof. Accordingly, to promote the progress in science and the useful arts, the invention is disclosed and is intended to be limited only by the scope of the appended claims.

What is claimed is:

1. An LED structure for producing various colored light and having two electrode supporting frames, one electrode supporting frame having a V-shaped slot, the LED structure comprising:

a) a light emission chip located in the V-shaped slot;

b) a first resin covering the light emission chip, the first resin being without fluorescent material;

c) a second resin containing fluorescent material for changing the length of light waves emanating from the light emission chip, the second resin comprising a layer spaced from the light emission chip; and, d) a third resin forming a sealing enclosure for the first and second resins, the third resin being without fluorescent material.

2. The LED structure of claim 1, wherein the layer of second resin has a side facing away from the light emission chip and further comprising a filter layer located on the side of the second resin layer facing away from the light emission chip.

3. The LED structure of claim 1, wherein the layer of second resin has an arcuate configuration.

4. The LED structure of claim 3, wherein the arcuate layer of second resin has a concavely curved side facing toward the light emission chip.

5. The LED structure of claim 1, wherein the first resin has an outer surface and wherein the second resin layer is applied to the outer surface of the first resin and is enclosed by the third resin.

6. The LED structure of claim 1, wherein the third resin has an inner surface and wherein the second resin layer is applied to the inner surface of the third resin.

7. The LED structure of claim 6, wherein the light emission chip comprises an ultraviolet light chip.

8. The LED structure of claim 5, wherein the light emission chip comprises an ultraviolet light chip.

9. The LED structure of claim 4, wherein the light emission chip comprises an ultraviolet light chip.

10. The LED structure of claim 3, wherein the light emission chip comprises an ultraviolet light chip.

11. The LED structure of claim 2, wherein the light emission chip comprises an ultraviolet light chip.

12. The LED structure of claim 1, wherein the light emission chip comprises an ultraviolet light chip.

13. An LED structure for producing various colored light and having a base with a concave slot, the LED structure comprising:

a) a light emission chip located in the concave slot;

b) a first resin located in the concave slot and covering the light emission chip, the first resin having a thickness measured from a bottom of the concave slot greater than a corresponding thickness of the light emission chip, the first resin being without fluorescent material;

c) a second resin containing fluorescent material for changing the length of light waves emanating from the light emissive chip, the second resin comprising a layer applied to a surface of the first resin; and, d) a third resin comprising a layer applied to a surface of the layer of second resin facing away from the light emissive diode, the third resin being without fluorescent material.

14. An LED structure for producing various colored light and having a base with a concave slot, the LED structure comprising:

a) a light emission chip located in the concave slot;

b) a first resin located in the concave slot and covering the light emission chip, the first resin having a thickness measured from a bottom of the concave slot greater than a corresponding thickness of the light emission chip, the first resin being without fluorescent material;

c) a second resin containing fluorescent material for changing the length of light waves emanating from the light emissive chip, the second resin comprising a layer applied to a surface of the first resin; and, d) a filter layer applied to a surface of the layer of second resin facing away from the light emissive diode.

* * * * *